United States Patent [19]
Nakao et al.

[11] Patent Number: 5,090,609
[45] Date of Patent: Feb. 25, 1992

[54] METHOD OF BONDING METALS, AND METHOD AND APPARATUS FOR PRODUCING SEMICONDUCTOR INTEGRATED CIRCUIT DEVICE USING SAID METHOD OF BONDING METALS

[75] Inventors: Takashi Nakao, Tokyo; Yoshiaki Emoto, Higashiyamato; Koichiro Sekiguchi, Tokyo; Masayuki Iketani, Kasugai; Kunizo Sahara, Hamura; Ikuo Yoshida, Musashimurayama; Akiomi Kohno, Tomobe; Masaya Horino, Chiyoda; Hideaki Kamohara, Katsuta; Shouichi Irie, Yokohama; Hiroshi Akasaki, Akishima; Kanji Otsuka, Higashiyamato, all of Japan

[73] Assignees: Hitachi, Ltd.; Hitachi VLSI Engineering Corp., both of Tokyo, Japan

[21] Appl. No.: 514,943

[22] Filed: Apr. 26, 1990

[30] Foreign Application Priority Data

Apr. 28, 1989 [JP] Japan .................................. 1-107649
May 17, 1989 [JP] Japan .................................. 1-123353
Nov. 29, 1989 [JP] Japan .................................. 1-309922

[51] Int. Cl.[5] ............................................. H01L 21/58
[52] U.S. Cl. .................................... 228/123; 228/6.2; 228/47; 228/124; 228/180.2
[58] Field of Search ....................... 228/180.2, 6.2, 47, 228/205, 123, 124

[56] References Cited

U.S. PATENT DOCUMENTS

| 4,166,563 | 9/1979 | Peyraud et al. | 228/221 X |
| 4,245,768 | 1/1981 | Sater | 228/205 X |
| 4,247,034 | 1/1981 | Burkart et al. | 228/221 X |

FOREIGN PATENT DOCUMENTS

| 62-249429 | 10/1987 | Japan . | |
| 224885 | 9/1988 | Japan | 228/221 |
| 63-310139 | 12/1988 | Japan . | |
| 1-97381 | 8/1990 | Japan | 228/221 |

OTHER PUBLICATIONS

Yosetsu Gijyutsu, Jul., 1987, pp. 88-91.

*Primary Examiner*—Kenneth J. Ramsey
*Attorney, Agent, or Firm*—Fay, Sharpe, Beall, Fagan, Minnich & McKee

[57] ABSTRACT

An invention relating to a technique for producing a chip mount type package or a TAB package with high reliability, without use of a flux which would cause environmental pollution or would hinder an enhancement of reliability, and more particularly pertaining to a method of irradiating bonding surfaces, for which a solder is used, and solder bump electrodes of a package with an atomic or ion energy beam and bonding the bonding surfaces to each other under normal pressure (about 1 atm) in a continuous apparatus.

24 Claims, 10 Drawing Sheets

METHOD OF BONDING METALS, AND METHOD AND APPARATUS FOR PRODUCING SEMICONDUCTOR INTEGRATED CIRCUIT DEVICE USING SAID METHOD OF BONDING METALS

BACKGROUND OF THE INVENTION

This invention relates to a method of bonding metals and to a technique for fabricating a semiconductor integrated circuit device using the method, which technique is effective when applied to a semiconductor integrated circuit device based on, for instance, the flip-chip system or TAB (Tape Automated Bonding) system.

In gate arrays or logic LSIs for microcomputers, etc., the number of terminals (input/output pins) for connection to external circuits has recently been rapidly increasing due to the increases in the number of functions and the packaging density of integrated circuits. The wire bonding system, in which connection of a semiconductor chip to external circuits is effected through wires bonded to bonding pads provided at the peripheral portions of the chip, has therefore been reaching the limit of application thereof. Besides, the wire bonding system has drawbacks in that the need for the wiring in an internal circuit region to be laid around to the bonding pads in the peripheral regions leads to a larger wiring length, resulting in a delay in signal transmission rate. The wire bonding system is thus unsuitable for mounting a logic LSI which requires high-speed operations.

For the reasons as mentioned above, attention has been paid to the flip chip system in which a semiconductor chip is mounted on a substrate through CCB bumps (projected electrodes) provided on Al electrodes of the chip by use of a solder material, and to the TAB system in which bumps comprising an Au-Sn eutectic alloy are provided on the Al electrodes and the semiconductor chip is mounted through the bumps onto leads provided on a principal surface of an insulation film. Especially, the flip chip system is an extremely effective mounting system for an increase in the number of pins of the semiconductor chip because the system makes it possible to provide terminals not only in the peripheral areas of the semiconductor chip but on the entire surface of the chip, namely, also in the internal circuit region of the chip. With the terminals provided in the internal circuit region, moreover, the wiring length is reduced, which makes the flip chip system extremely effective for use as a system for mounting a high-speed LSI.

As a method of providing the CCB bumps in the above-mentioned flip chip system, there have been used a solder vapor deposition method and a solder ball supply method. In the solder vapor deposition method, for instance, the CCB bumps are provided as follows. First, thin films comprising Cr, Cu and Au, for instance, are sequentially vapor deposited on the Al electrodes of the semiconductor chip to provide a soldering primary coat (BLM: Bump Limiting Metallization). Of the primary coat for soldering, Cr in the lowermost layer is provided for preventing an allying reation between the solder bump and the Al electrode, whereas Cu in the intermediate layer is provided for enhancing the wettability by solder, and Au in the uppermost layer is provided for preventing corrosion of Cu therebeneath. Next, a solder film comprising a pb-Sn alloy or the like is selectively vapor deposited on the soldering primary coat, and the solder film is melted by heating in a melting furnace filed with an inert gas atmosphere, to form spherical CCB bumps by utilizing the surface tension of the solder film thus melted. On the other hand, the solder ball supply method is a method in which contaminants such as oxides, moisture, oils and fats, etc., deposited on the surfaces of the Al electrodes are removed completely by ion impacts and then spherical solder balls are superposed on the cleaned surfaces in an ultra high vacuum, followed by bonding, as for instance described on pages 88-91 of "Yosetsu Gijutsu (Welding Technology)" issued in July, 1987.

A chip carrier is one of the semiconductor integrated circuit devices based on the above-mentioned flip chip system. The chip carrier is described in, for instance, Japanese Patent Application Laid-Open (KOKAI) Nos. 62-249429 (1987) and 63-310139 (1988).

FIG. 15 shows a sectional structure of a chip carrier described in the above-mentioned literature. The chip carrier 50 has a packaged structure in which a semiconductor chip 54 connected through CCB bumps 53 to electrodes 52 provided on a principal surface of a package substrate 51 comprising a ceramic material, such as mullite, is hermetically sealed (or encapsulated) by a cap 55. The cap 55 comprises, for instance, aluminum nitride (AlN) and is bonded to the principal surface of the package substrate 51 through a sealing solder 56.

The back side (upper surface) of the semiconductor chip 54 is bonded to a lower surface of the cap 55 through a heat-transmitting solder 57, in order that the heat generated from the chip 54 is transmitted through the solder 57 to the cap 55. Electrodes 52 on the lower surface of the package substrate 51 are provided thereon with CCB bumps 58 for mounting the chip carrier 50 on a module substrate or the like. The CCB bumps 58 are bonded to the electrodes 52 by, for instance, the solder ball supply method, after fabrication of the chip carrier 50 is completed. The package substrate 51 is provided therein with an internal wiring 59 comprising W (tungsten), for instance, through which the electrodes 52, 52 on the principal surface and the lower surface of the package substrate 51 are electrically connected.

To fabricate the above-mentioned chip carrier, first, the CCB bumps of the semiconductor chip are positioned accurately on the electrodes on the principal surface of the package substrate by a chip mounting device. In this case, a flux is applied to bonding portions of the CCB bumps and the electrodes. The flux is applied for removal of natural oxide films formed on the surfaces of the solder constituting the CCB bumps and for preventing the re-oxidation of the solder surfaces at the time of reflow. A further purpose of flux application is to enhance the wettability by solder at the time of reflow.

Subsequently, the package substrate is transferred into a reflow furnace. It is necessary, in this transfer, to prevent the slippage of the CCB bumps due to vibration or the like. The flux serves also for the prevention of the slippage. The reflow furnace is provided therein with an inert gas atmosphere, in which the CCB bumps are re melted by heating, whereby the semiconductor chip is bonded, with its face side down, to the principal surface of the package substrate (namely, facedown bonding is effected).

Next, the cap is soldered to the principal surface of the package substrate by the sealing solder. In addition, the back side of the semiconductor chip is soldered to the lower surface of the cap by the heat-transmitting solder. The soldering of the cap to the principal surface of the package substrate is carried out by preliminarily depositing a sealing preliminary solder on the principal surface of the package substrate and base portions of the cap, applying a flux to the surfaces of the preliminary solder, then placing the cap on the principal surface of the package substrate, and re-melting the preliminary solder by heating in the reflow furnace. The soldering of the back side of the semiconductor chip to the lower surface of the cap is carried out by preliminarily depositing a heat-transmitting preliminary solder on the lower surface of the cap or on the back side of the semiconductor chip, applying a flux to the surface of the preliminary solder, and then re melting the preliminary solder by heating in the reflow furnace.

The operation of soldering the cap to the principal surface of the package substrate and the operation of soldering the back side of the semiconductor chip to the lower surface of the cap are carried out in the same step. The sealing solder and the heat-transmitting solder, therefore, comprise solder materials having approximately equal melting temperatures. Besides, the melting temperatures of the sealing solder and the heat-transmitting solder are lower than the melting point of the solder constituting the CCB bumps; otherwise, the CCB bumps would be re-melted at the time of re meting the preliminary solders by heating in the reflow furnace, and the CCB bumps would collapse under the load of the cap, leading to short circuit between adjacent ones of the CCB bumps. For this reason, the CCB bumps comprise a high-melting solder, for instance, a Pb Sn alloy with an Sn content of about 2 to 3% by weight (melting temperature=about 320° to 330°C.), whereas the sealing solder and the heat-transmitting solder each comprise a low-melting solder, or instance, a Pb Sn alloy with an Sn content of about 10% by weight (melting temperature=about 290° to 300° C.).

Thus, in the chip carrier fabrication step, which involves the step of mounting the semiconductor chip on the principal surface of the package substrate through the CCB bumps and the step of soldering the cap to the principal surface of the package substrate to encapsulate (or hermetically seal) the semiconductor chip or of soldering the back side of the semiconductor chip to the lower surface of the cap, the acceptability of the soldering affects greatly the reliability of connection of the CCB bumps, the reliability of hermetic seal (or encapsulation) of the package and the cooling efficiency.

Another method of bonding the solder balls is known, in which contaminants such as oxides, moisture, oils and fats, etc., deposited on the bonding surfaces are completely removed by ion impacts, and the materials are superposed one on the other and bonded in an ultrahigh vacuum, as described on pages 88-91 of the "Yosetsu Gijutsu (Welding Technology)" issued in July, 1987.

SUMMARY OF THE INVENTION

The TAB system and the flip chip system as mentioned above involve the following problems.

First, the TAB system has been pointed out to have the problem of the increased manufacturing cost of TAB packages due to the formation of expensive Au-containing bumps on the Al electrodes of the semiconductor chip.

On the other hand, the flip chip system has the following problems.

(1) A step of cleaning a flux is required after the reflow step, and the number of mounting steps is increased accordingly. The use of a cleaning liquid, such as a chlorohydrocarbon, a fluorohydrocarbon, etc., in the flux cleaning step has been becoming controlled, from the viewpoint of protection of natural environments. In view of this, it is urgently demanded to eliminate the flux cleaning step.

(2) It is difficult to remove the flux completely by cleaning, and the residue of the flux causes corrosion of the wiring of integrated circuits. In addition, the residue of the flux induces voids or other defects in the soldered portions, leading to a lower reliability of connection of the CCB bumps and in the case of a chip carrier, to a lower reliability of hermetic seal of the package, a lower cooling efficiency, etc.

(3) With the flux used, it is yet difficult to remove in a short time the natural oxide films formed on the surfaces of solder. Therefore, it is necessary for the temperature in the reflow furnace, at the time of re-melting the solders by heating, to be much higher than the meting temperatures of the solders, resulting inevitably in heat damage to the semiconductor chip. Besides, the re-melting of the solders requires a long time and, therefore, a reflow furnace of a greater capacity.

(4) There are difficulties in handling operations, for examples, chucking, moving or positioning the materials to be bonded in an ultra high vacuum region ($10^{-8}$ to $10^{-11}$ Torr), with the resultant poor mass-production properties. The operations of holding the materials to be bonded in a vacuum chamber, moving the materials to predetermined positions, superposing the bonding surfaces on each other and bonding the bonding surfaces require very complicated mechanisms, rendering it difficult to achieve the intended bonding with high dimensional accuracy. Moreover, an adhesion problem occurs at mechanical sliding portions in a vacuum.

(5) It is difficult to apply ion beam irradiation to semiconductors (LSI, etc.) or ceramics. The surfaces of a semiconductor chip is generally coated with an insulator film, and irradiation thereof with an ion beam causes a damage to the device through charge-up. In the case of a highly insulating ceramic, it is difficult to clean a bonding surface of the ceramic by irradiation with an ion beam.

(6) In the conventional bonding method, for satisfactory close contact of bonding surfaces it has been necessary to finish the bonding surfaces to an ultra smooth condition. In practice, the bonding surfaces are rugged, and simple superposition of the surfaces on each other rarely results in close contact (that is, the area of vacuum connection is very small). Therefore, the bonding surfaces require an ultra smooth finish.

It is an object of this invention to provide a technique for successfully overcoming the above-mentioned drawbacks involved in the use of a flux, in a semiconductor integrated circuit device based on the flip chip system.

It is another object of this invention to provide a technique for reducing the manufacturing cost of a semiconductor integrated circuit device based on the TAB system.

It is a further object of this invention to provide a bonding technique in which handling of materials to be bonded is easy and which is suitable for mass-production.

It is yet another object of this invention to provide a technique for cleaning the bonding surfaces of an insulating material such as a ceramic in a semiconductor chip.

It is a still further object of this invention to provide a technique for giving the bonding surfaces an ultra smooth finish.

The above and other objects and novel features of this invention will become apparent from the descriptions in this specification and the accompanying drawings.

Of the inventions disclosed in this application, some representative ones will be summarized as follows.

A method of producing a flip chip package according to one invention in this application is a method for facedown bonding of a semiconductor chip to a substrate through CCB bumps, which comprises first placing the semiconductor chip and the substrate into a vacuum vessel, irradiating the surfaces of the CCB bumps and the surfaces of electrodes on the substrate with an atomic or ion energy beam to clean bonding surfaces, then transferring the semiconductor chip and the substrate into a vessel filled with a high-purity inert gas atmosphere, pressing the CCB bumps against the electrodes under normal pressure (about 1 atm) to effect temporary bonding, and effecting the reflow of the CCB bumps to achieve the desired bonding. For formation of the high-purity inert gas atmosphere, for instance, use is made of a single gas or mixed gas having an oil and fat content and an oxygen content of not more than 10 ppb each, a moisture content of not more than 100 ppb, and a dew point of not higher than $-70°$ C.

A method of producing a flip chip package according to another invention in this application is a facedown bonding method in which CCB bumps provided by use of a non eutectic solder are melted and then immediately cooled rapidly, whereby a eutectic solder layer or a solder layer close in composition to the eutectic solder layer is preliminarily segregated to the surface of the non-eutectic solder, followed by the same procedure as in the method according to the one invention mentioned above.

A method of producing a TAB package according to a further invention in this application is a method for gang bonding of a semiconductor chip through bumps to leads provided on a principal surface of an insulation film, which comprises first placing the semiconductor chip and the insulation film into a vacuum vessel, irradiating the surfaces of the bumps and the surfaces of the leads with an atomic or ion energy beam, then immediately transferring the semiconductor chip and the insulation film into a vessel filled with a high-purity inert gas atmosphere, and pressing the leads against the bumps in the vessel to achieve the desired bonding.

A method of bonding metals according to yet another invention in this application comprises irradiating bonding surfaces of a pair of metal members placed in a vacuum vessel with an atomic or ion energy beam, then transferring the metal members into a vessel filled with a high-purity inert gas atmosphere, and pressing the bonding surfaces against each other under norma pressure. The pressing of the bonding surfaces against each other may be accompanied by heating the metal members at a temperature not higher than the melting temperatures of the members. Furthermore, a metal softer than the metals to be bonded may be preliminarily provided on the surface of at least one of the metal members so as to utilize a plastic deformation of the softer metal for the intended bonding. In that case, for lowering the bonding pressure required, the bonding portions may be heated to lower the yield point of the softer metal.

The method of producing a flip chip package according to the one invention in this application has the following effects.

(a) The irradiation of the surfaces of the CCB bumps and the surfaces of the electrodes on the substrate with the atomic or ion energy beam produces a sputtering effect by which natural oxide films and foreign matter are removed from the surfaces. It is thus possible to activate the surfaces of the CCB bumps and the surfaces of the electrodes.

(b) The process of transferring the semiconductor chip and the substrate into the vessel filled with the high-purity inert gas atmosphere, immediately upon the surface activation by irradiation with the energy beam, and performing temporary bonding and reflow of the solder makes it possible to prevent the re-formation of natural oxide films on the surfaces of the CCB bumps and to prevent the re-deposition of foreign matter on the surfaces of the bumps and electrodes.

(c) Where the energy beam is an electrically neutral atomic beam, charge up on the irradiated surfaces, which would occur in the case of using an ion beam, does not take place and, accordingly, it is possible to reduce the irradiation damage to the semiconductor chip. It is also possible, by the irradiation with an atomic beam, to clean easily the surface of a glass, ceramic, plastic or other similar insulating material. On the other hand, where irradiation with an ion beam is carried out for cleaning the surface of the insulating material, it is recommendable to irradiate the surface with an electron shower simultaneously with the ion beam irradiation, thereby neutralizing the charges of ions.

(d) The temporary bonding by pressing the CCB bumps against the electrodes on the substrate, prior to the reflow step, makes it possible to prevent the slippage of the CCB bumps due to vibrations or the like in transfer of the substrate to the reflow step.

(e) The above effects (a) to (d), altogether, eliminate the need to use a flux in facedown bonding of the semiconductor chip to the substrate through the CCB bumps.

(f) With the reflow effected in the absence of natural oxide films on the surfaces of the CCB bumps, it is possible to melt the CCB bumps at a temperature lower than the melting temperature of the bumps and, therefore, to reduce the heat damage to the semiconductor chip. It is also possible to shorten the time necessary for the CCB bumps to be melted and the subsequent cooing time, and to use a reflow furnace of a smaller capacity.

(g) The temporary bonding by pressing the CCB bumps against the electrodes on the substrate ensures perfect contact of the CCB bumps with the electrodes, prior to the reflow step, thereby enabling prevention of failures in connection of the CCB bumps due to diameter dispersion of the bumps or warpage of the substrate.

In the method of fabricating a flip chip package according to the another invention in this application, the eutectic solder layer or the solder layer close in composition to the eutectic solder layer is preliminarily segregated to the surfaces of the CCB bumps comprising a eutectic solder, whereby it is possible to effect the reflow of the solder at a temperature in the vicinity of the eutectic point of the solder (about 183° C.) and, therefore, to further reduce the heat damage to the semiconductor chip. It is also possible, by the method, to further promote shortening of the reflow time and reduction in the capacity of a reflow furnace.

The method of producing a TAB package according to the further invention in this application enables formation of the bumps by use of a metallic material less expensive than Au, thereby enabling a reduction in the manufacturing cost of the TAB package.

In the method of bonding metals according to the yet another invention in this application, heating of the metals to be bonded makes the metals themselves softer, whereby adhesion of bonding surfaces is enhanced. When a metal softer than the metals to be bonded is preliminarily provided on the bonding surfaces, it is possible to enhance the adhesion of the bonding surfaces easily through utilization of a plastic deformation of the softer metal.

BRIEF DESCRIPTION OF THE DRAWINGS

FIG. 14 (b) is an enlarged partial view of a package seal portion in the chip carrier;

DESCRIPTION OF A PREFERRED EMBODIMENT

Figure 14A:
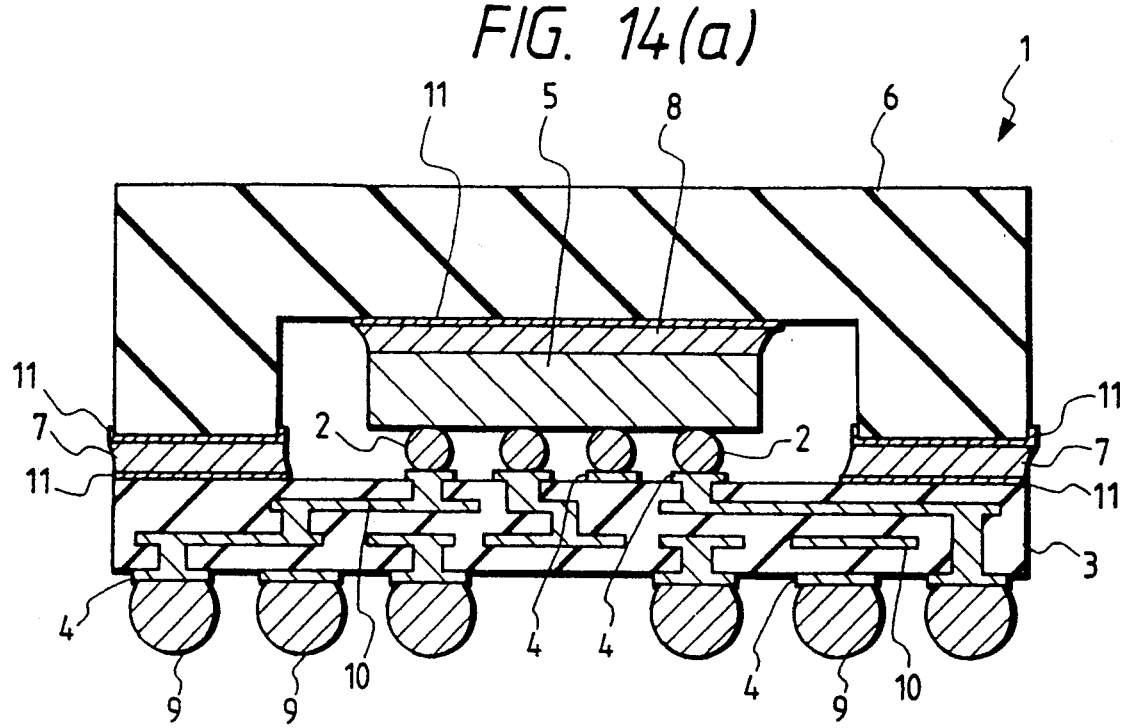
FIG. 14 (a) is a sectional view of a chip carrier produced by the embodiment.
Figure 15:
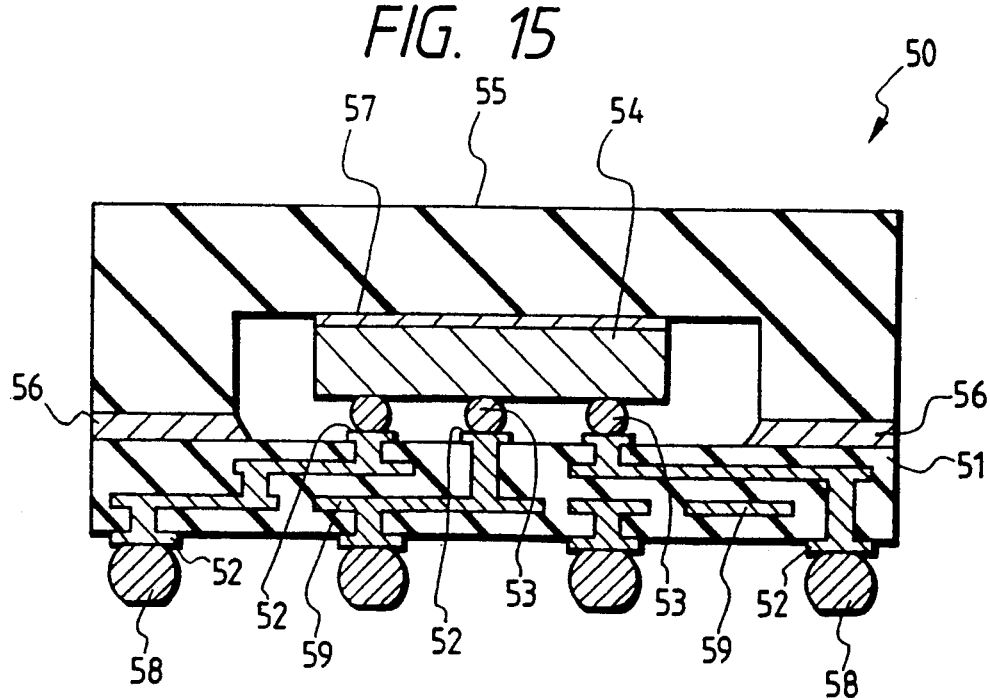
FIG. 15 is a sectional view of a conventional chip carrier.
Figure 14B:
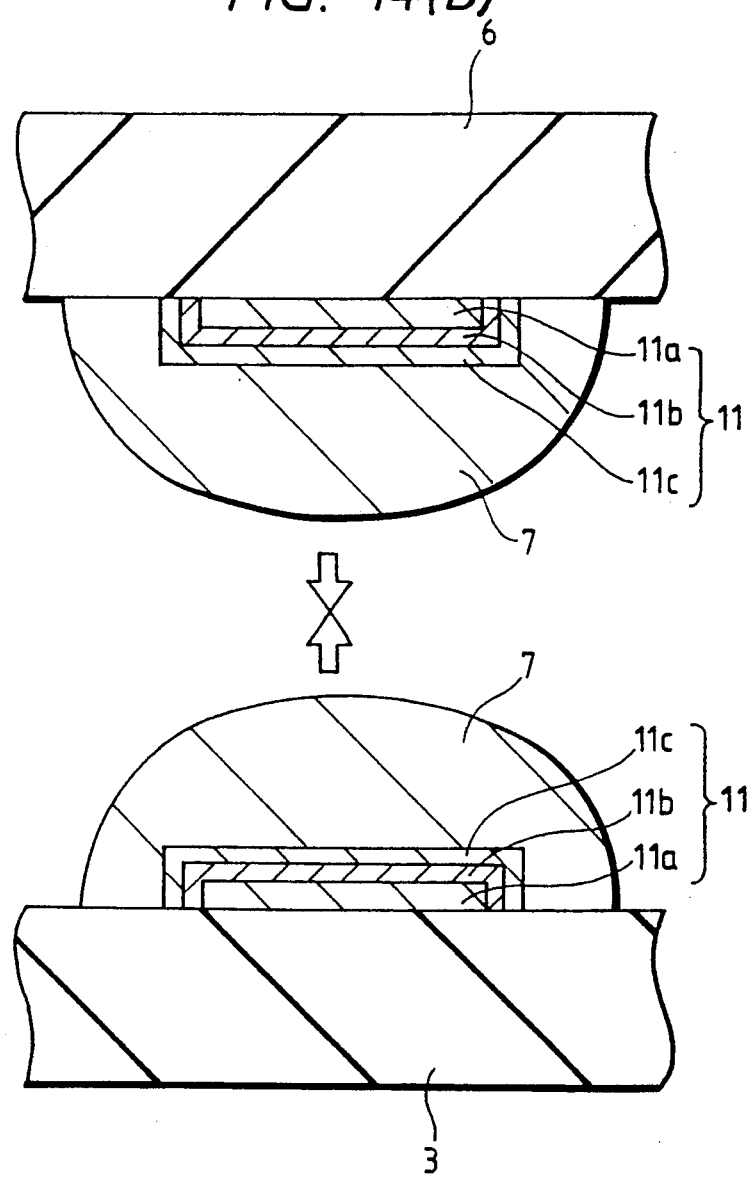

FIG. 14 (a) shows a sectional structure of a chip carrier 1 obtained by the method according to this embodiment.

The chip carrier 1 has a packaged structure in which a semiconductor chip 5 facedown bonded to electrodes 4 on a principal surface of a package substrate 3 through CCB bumps 2 is encapsulated (or hermetically sealed) by a cap 6. The cap 6 is soldered to the principal surface of the package substrate 3 through a sealing solder 7, and the back side of the semiconductor chip 5 is soldered to the lower surface of the cap 6 through a heat transmitting solder 8. To electrodes 4 on the lower side of the package substrate 3, CCB bumps 9 greater in diameter than the above CCB bumps 2 are bonded. The CCB bumps 9 are electrically connected to the CCB bumps 2 through an internal wiring 10 comprising W (tungsten) or the like, and further to the semiconductor chip 5. The CCB bumps 9 serve as external terminals at the time of mounting the chip carrier 1 on a module substrate, and are bonded to the electrodes 4 on the lower side of the package substrate 3 after completion of the step of encapsulating (hermetically sealing) the chip carrier 1.

A soldering metallization layer (primary metal coat) 11 is provided, as required, on a peripheral portion of the principal surface of the package substrate 3 and on a base portion of the cap 6, as shown in FIG. 14 (b). The soldering metallization layer 11 comprises a composite metallic film in which, for instance, a chromium (Cr), titanium (Ti) or tungsten (W) film 11a, a copper Cu), nickel (Ni) or platinum (Pt) film 11b and a gold (Au) film 11c are provided in layers. A soldering metallization layer 11 comprising the composite metallic film is provided also on the lower surface of the cap 6, as required. The soldering metallization layers 11 are provided primarily for enhancing the wettability by the sealing solder 7 and the heat-transmitting solder 8.

The package substrate 3 comprises a ceramic material such as mullite ($3Al_2O_3 \cdot 2SiO_2$), whereas the cap 6 comprises, for instance, aluminum nitride (AlN) or silicon carbide (SiC). The CCB bumps 2 comprise, for example, a Pb-Sn alloy having an Sn content of about 2 to 3% by weight (melting temperature=about 320° to 330° C.), and the CCB bumps 9 comprise, for instance, an Sn-Ag alloy having an Aq content of about 3.5% by weight (melting point=about 220° to 230° C.). The sealing solder 7 and the heat-transmitting solder 8 each comprise, for instance, a pb-Sn alloy having an Sn content of about 10% by weight (melting temperature=-about 290° to 300° C.

Figure 2:
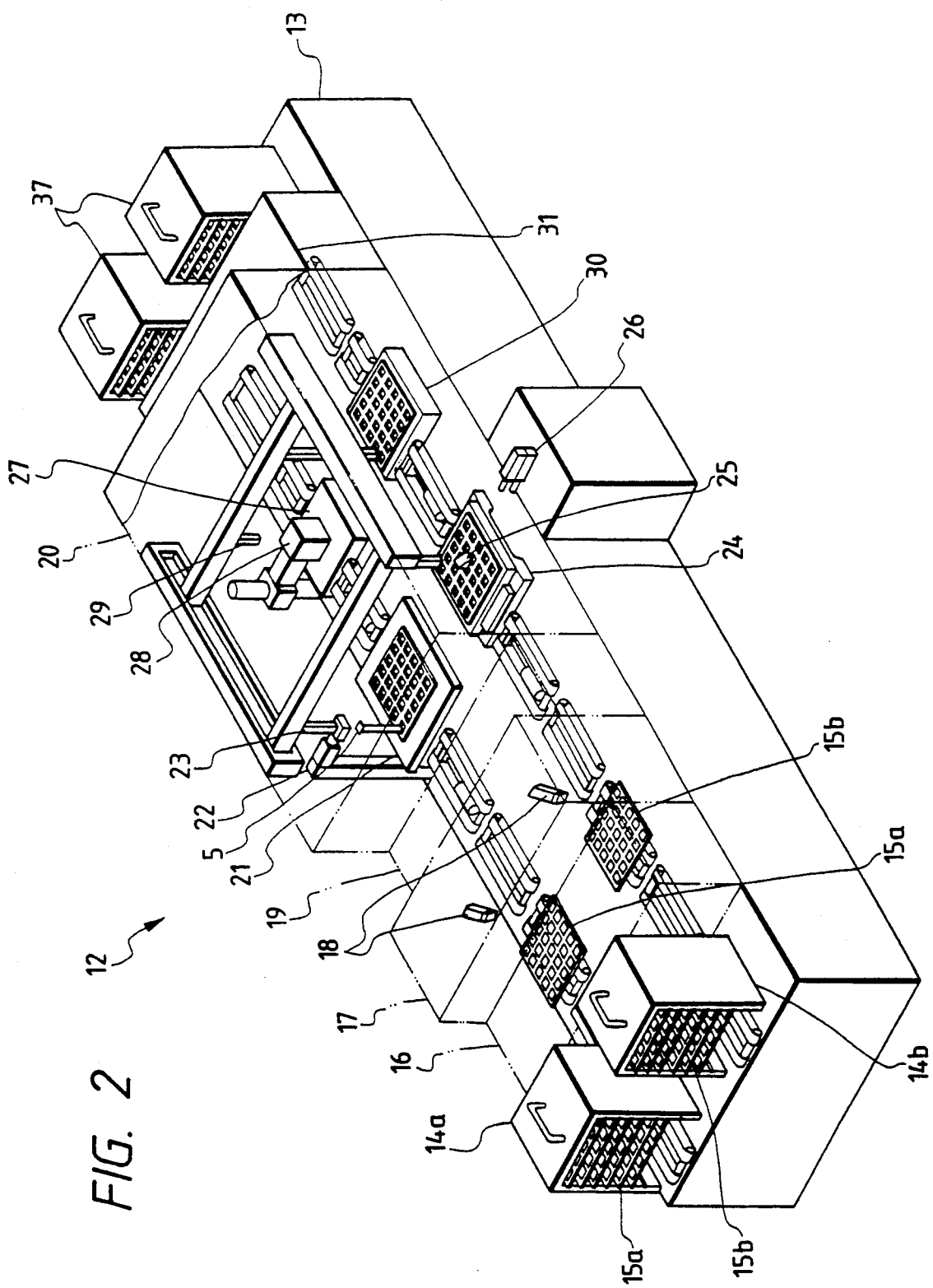
FIG. 2 is a schematic perspective view of an apparatus for fabricating the semiconductor integrated circuit device, used in the embodiment.

FIG. 2 shows an important portion of an apparatus 12 used for the step of fabricating the above-mentioned chip carrier 1.

The apparatus 12 comprises loading magazines 14a and 14b provided at one end (on this side of the figure) of a base 13 of the apparatus. One of the loading magazines, 14a, contains a multiplicity of chip trays 15a, each of which carries a predetermined number of semiconductor chips 5 placed thereon. Each of the semiconductor chips 15 is placed in the condition where the side on which CCB bumps 2 are provided is directed up. The other loading magazine 14b contains a multiplicity of substrate trays 15b, each of which carries a predetermined number of package substrates 3 placed thereon. Each of the package substrate 3 is placed, with its principal surface up.

The trays 15a and 15b contained in the loading magazines 14a and 14b are first transferred into a surface activation chamber 17 through a first load-lock chamber 16. The surface activation chamber 17 is so designed to be capable of being evacuated to a vacuum degree of up to $10^{-6}$ Torr. The surface activation chamber 17 is provided with a pair of source guns 18, 18 for converting an Ar gas introduced therein into an atomic beam. The atomic beam is used to irradiate the semiconductor chips 5 and the package substrates 3 therewith to perform a surface activation treatment of the CCB bumps 2 and the electrodes 4, as described later.

Upon completion of the surface activation treatment, the semiconductor chips 5 and the package substrates 3 are immediately transferred into a bonding chamber 10 through a second load-lock chamber 19, in the state of being contained respectively in the trays 15a and 15b. The bonding chamber 20 is provided therein with a high-purity inert gas atmosphere at normal pressure (about 1 atm). The high-purity inert gas atmosphere, supplied from gas supplying means provided in the bonding chamber, is a nitrogen, Ar or other similar inert gas atmosphere from which moisture oil and fat components and oxygen have been removed chemically through a gas cleaner or the like.

The bonding chamber 20 is provided therein with a temporay bonding mechanism which comprises a chip inversion stage 21, a chip inversion unit 22, a chip mounting hand 23, a temporay bonding stage 24, a prism mirror 25, a position recognition camera 26, etc., and with a fusion bonding mechanism which comprises a fusion bonding stage 27, a heat bock 28, a chip transfer hand 29, an aligning stage 30, etc. These mechanisms are used to perform the temporary bonding and permanent bonding, which will be described later.

After the temporary bonding and permanent bonding are finished, the package substrates 3 with the semiconductor chips 5 facedown-bonded thereto are placed on the substrate tray 15b, to be contained into an unloading magazine 37 through a third load-lock chamber 31.

Now, the method of fabricating the chip carrier 1 by use of the above apparatus 12 will be explained in detail.

Figure 3:
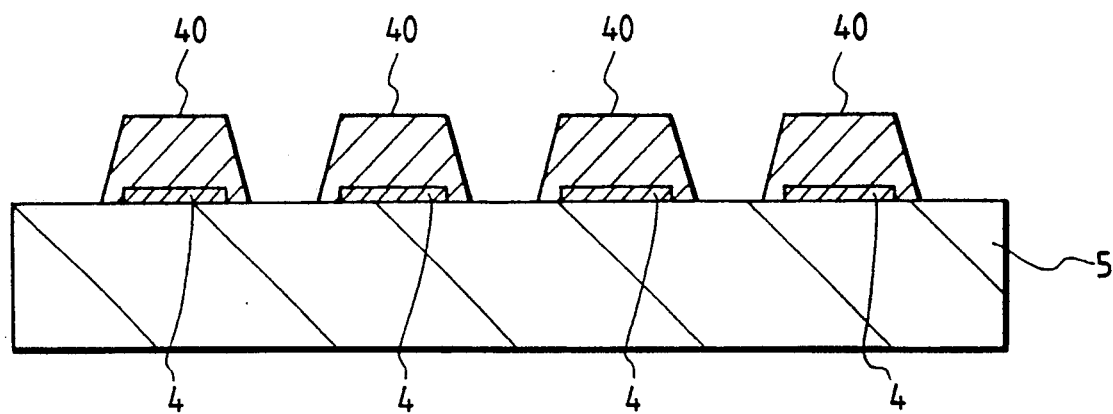
FIGS. 3 and 4 are each a sectional view of a semiconductor chip, illustrating a CCB bump forming step in the embodiment.

First, as shown in FIG. 3, a solder film 40 is provided selectively on each electrode 4 of the semiconductor chip by, for example, a solder vapor deposition method. The electrodes 4 of the semiconductor chip 5 comprise Al, and a soldering primary coat comprising a composite metallic film of Cr, Cu and Au is vapor deposited on the surfaces of the electrodes 4. The solder film 40 comprises a non-eutectic Pb Sn alloy having an Sn content of about 2 to 3% by weight (melting temperature=320° to 330° C.).

Figure 4:
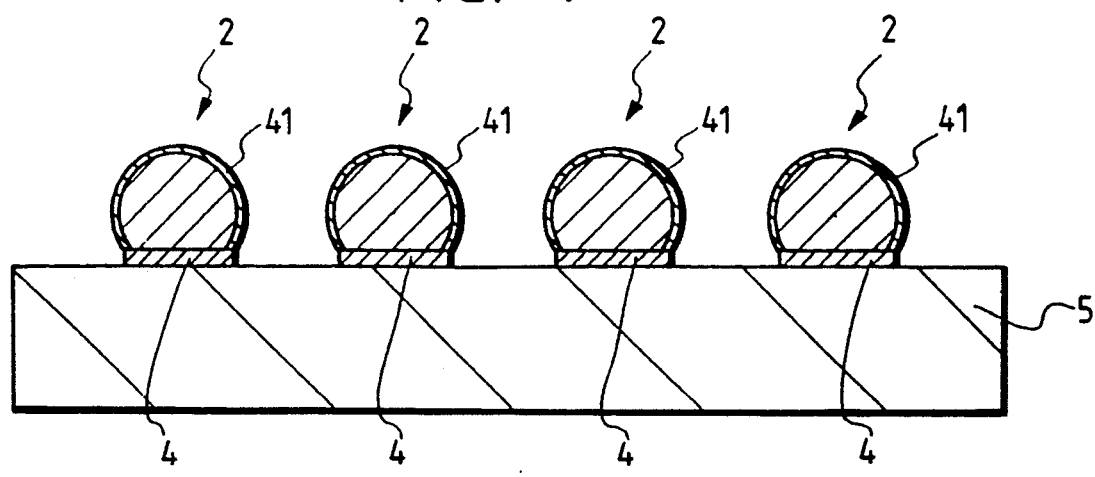

Subsequently, the solder film 40 is melted by heating in a melting furnace filled with a nitrogen, Ar or other similar inert gas atmosphere, to provide spherical CCB bumps 2 through utilization of the surface tension of the solder upon melting. The CCB bumps 2 thus melted are rapidly cooled, whereby a thin eutectic solder layer comprising a eutectic Pb-Sn alloy with an Sn content of 60% by weight (or a solder layer with a composition close to the eutectic solder composition) 41 is segregated to the surfaces of the CCB bumps 2, as shown in FIG. 4. The melting point (eutectic point) of the eutectic solder layer 4 is about 183° C., which is much lower than the melting temperature of the non-eutectic Pb-Sn alloy constituting the inside layer of the CCB bumps 2.

Next, a predetermined number of the semiconductor chips 5 are paced on the chip tray 15a, and are contained into the loading magazine 14a of the apparatus 12. Also, a predetermined number of the package substrates 3 are placed on the substrate tray 15b, and are contained into the loading magazine 14b.

Now, the step of facedown bonding of the semiconductor chips 5 to the principal surface of the package substrate 3 will be explained, according to the flow diagram in FIG. 1.

As has been explained referring to FIG. 2, one chip tray 15a and one substrate tray 15b are transferred into the load-lock chamber 16, which is once evacuated to a vacuum degree of about $10^{-6}$ Torr, and then the chip tray 15a and the substrate tray 15b are transferred into the surface activation chamber 17. The surface activation chamber 17 is evacuated beforehand to a vacuum degree of about $10^{-6}$ Torr. Subsequently, a high-purity Ar gas with a moisture content of 100 ppb or below and a dew point of $-70°$ C. or below is supplied into the surface activation chamber 17, to a vacuum degree of about $10^{-3}$ to $10^{-4}$ Torr, and the source guns 18 are operated to irradiate the semiconductor chips 5 and the package substrates 3 with Ar atomic beams for about 5 minutes. By rotating the trays 15a and 15b during the irradiation, it is possible to irradiate the surfaces of the CCB bumps 2 and the surfaces of the electrodes 4 uniformly with the Ar atomic beams.

With the semiconductor chips 5 and the package substrates 3 thus irradiated uniformly with the Ar atomic beams in the surface activation chamber 17, a sputtering effect is produced to remove the natural oxide films and foreign matter from the surfaces of the CCB bumps 2 and the surfaces of the electrodes 4, whereby the surfaces are activated.

Next, the trays 15a and 15b are transferred from the surface activation chamber 17 into the second load-lock chamber 19. The load-lock chamber 19 is evacuated beforehand to a vacuum degree of about $10^{-3}$ to $10^{-4}$ Torr. Subsequently, a high-purity nitrogen gas (or Ar gas) is supplied into the load-lock chamber 19 to once provide normal pressure (about 1 atm) inside the chamber. Thereafter, the trays 15a and 15b are transferred into the bonding chamber 20, in which the chip tray 15a is placed on the chip inversion stage 21, and the substrate tray 15b on the temporary bonding stage 24. The bonding chamber 20 is supplied beforehand with the high-purity nitrogen gas (or Ar gas) to obtain normal pressure. The high-purity gas to be supplied into the bonding chamber 20 may be, for example, a reducing gas obtained by adding about 10 to 20% of a hydrogen gas to a nitrogen gas.

Thus, after the surface activation treatment by irradiation with the Ar atomic beams, the semiconductor chips 5 and the package substrates 3 are immediately transferred into the bonding chamber 20 filed with the high-purity inert gas atmosphere. Namely, the fabrication of the chip carrier is carried out in a continuous apparatus, thereby preventing the re-formation of natural oxide films or re deposition of foreign matter on the surfaces of the CCB bumps 2 or the surfaces of the electrodes 4 during the transfer from the surface activation chamber 17 into the bonding chamber 20.

Figure 5A:
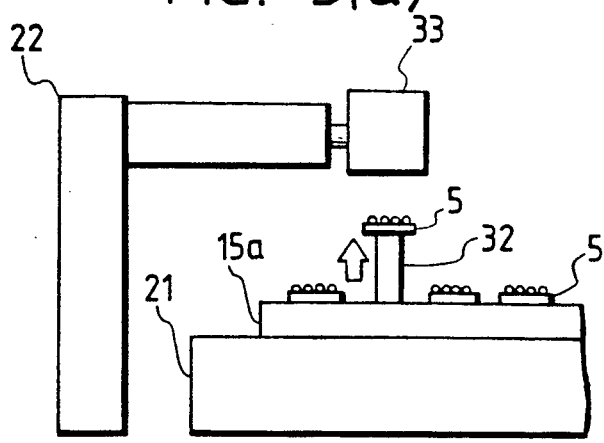
FIGS. 5(a) to 5(c) are each a partial front view of a temporary bonding mechanism in the apparatus used in the embodiment.
Figure 5B:
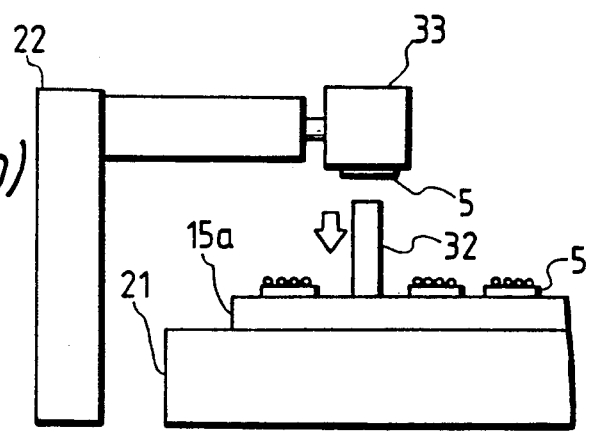
Figure 5C:
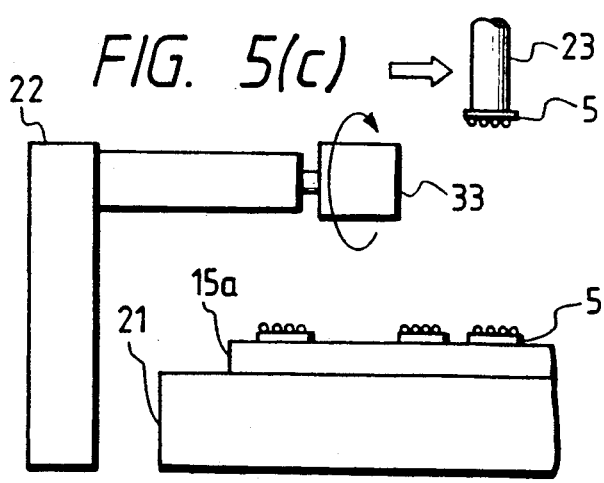

Next, as shown in FIG. 5 (a), a plunge-up pin 32 embedded in the chip inversion stage 21 is raised from the back side of the chip tray 15a to lift up one of the semiconductor chips 5. Then, as shown in FIG. 5 (b), the semiconductor chip 5 is attracted by suction onto the lower end of a collet 33 kept waiting on the upper side of the chip 5. Subsequently, as shown in FIG. 5 (c), the collet 33 is inverted, or turned 180°, and the semiconductor chip 5 is sucked onto the lower end of a chip mounting hand 23 kept waiting on the upper side of the collet 33, whereby the chip 5 is transferred onto the temporary bonding stage 24. During the transfer, the semiconductor chip 5 is heated by a heater (not shown) incorporated in the chip mounting hand 23. The heating is carried out at a temperature (e.g., 150° C.) sightly lower than the melting point (183° C.) of the eutectic solder.

Figure 6:
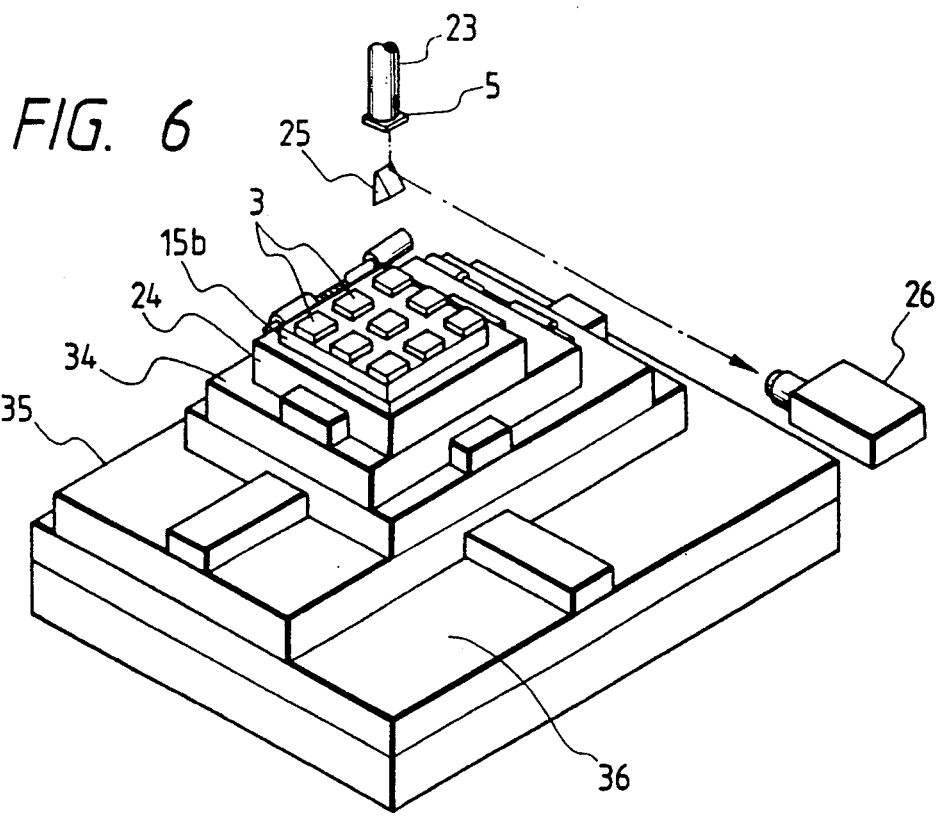
FIG. 6 is a partial perspective view of a temporary bonding mechanism in the apparatus used in the embodiment.

As shown in FIG. 6, a predetermined number of package substrates 3 placed on the substrate tray 15b are set waiting on the temporary bonding stage 24. The chip mounting hand 23 with the semiconductor chip 5 held thereon by suction is stopped at a position on the upper side of the temporary bonding stage 24. Thereafter, the image of the semiconductor chip 5 projected on a prism mirror 25 is detected by the position recognition camera 26, and a precision XY table 34, a high-speed XY table 35 and a turntable 36 are driven to match the positions of the CCB bumps 2 accurately to the positions of the corresponding electrodes 24.

Figure 7:
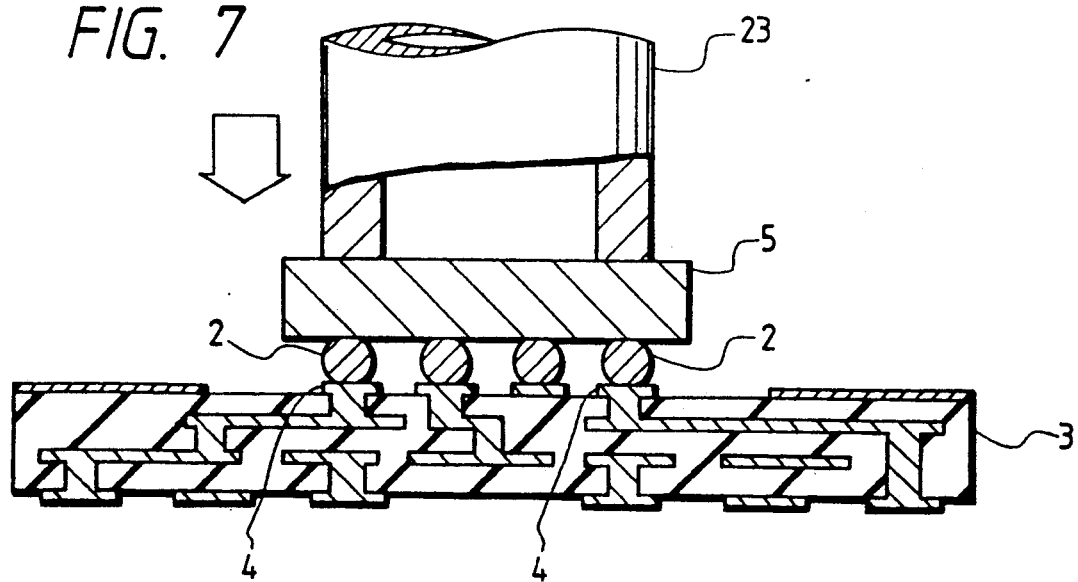
FIGS. 7 and 8 are each a sectional view of a semiconductor chip and a package substrate, illustrating a facedown bonding step in the embodiment.

Subsequently, as illustrated in FIG. 7, the chip mounting hand 23 is lowered to press the CCB bumps 2 against the electrodes 4 for about 10 seconds, under a load of about 0.5 kgf/cm$^2$ on the back side of the semiconductor chip 5. This causes the CCB bumps 2, preliminarily heated to the temperature slightly lower than the melting point of the eutectic solder, to be plastically deformed easily and be temporarily bonded to the electrodes 4.

With the CCB bumps 2 thus temporarily bonded to the electrodes 4 prior to permanent bonding, all the CCB bumps 2 are brought into perfect contact with the corresponding electrodes 4, and failure in connection between the CCB bumps 2 and the corresponding electrodes 4 is prevented from arising from diameter dispersion of the CCB bumps 2 or warpage of the package substrate 3.

Next, the semiconductor chip 5 temporarily bonded to the principal surface of the package substrate 3 as above is again held by suction onto the chip mounting hand 23, and is transferred onto the fusion bonding stage 27 together with the package substrate 3.

With the package substrate 3 (and the semiconductor chip 5 temporarily bonded to the principal surface of the substrate 3) thus transferred onto the fusion bonding stage 27 after the temporary bonding of the CCB bumps 2 to the electrodes 4, the slippage between the CCB bumps 2 and the corresponding electrodes 4 is prevented from occurring due to vibration or the like during the transfer.

Figure 8:
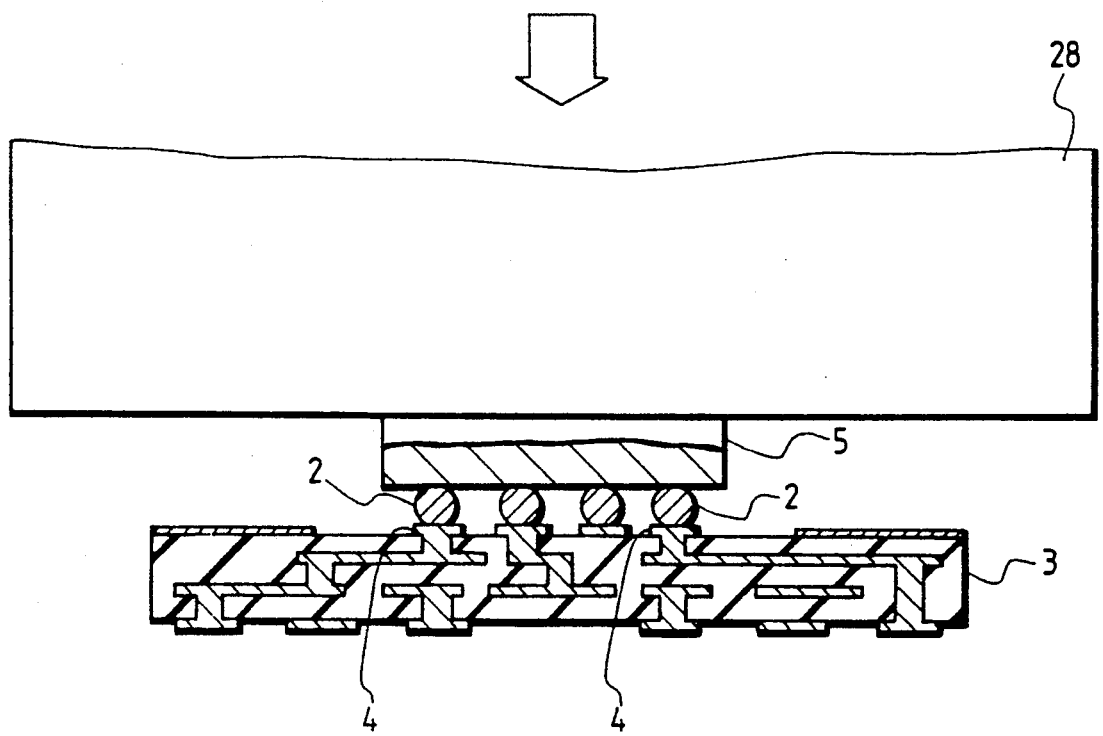

Subsequently, as shown in FIG. 8, the heat block 28 disposed on the upper side of the fusion bonding stage 27 is lowered to heat the semiconductor chip 5 while exerting a load of about 0.5-5 kgf/cm$^2$ on the back side of the chip 5. The heating is carried out at a temperature (e.g., 200° C.) sightly higher than the melting point (183° C.) of the eutectic solder. By the heating, the thin eutectic solder layer 41 preliminarily segregated to the surface of each CCB bump 2 is melted and caused to diffuse into the CCB bump and into the electrode 4, whereby the CCB bump 2 and the corresponding electrode 4 are bonded firmly to each other. The application of the load to the back side of the semiconductor chip 5 enhances the wettability by the melted eutectic solder layer 41.

After the facedown bonding of the semiconductor chip 5 to the principal surface of the package substrate 3 is carried out as mentioned above, the chip 5 is sucked by the chip transfer hand 29, and is transferred together with the substrate 3 onto an aligning stage 30, to be paced on the substrate tray 15a. After the semiconductor chips 5 and the package substrates 3 are cooled to room temperature, the substrate tray 15a is contained into the unloading magazine 37 through the third load-lock chamber 31, whereby the facedown bonding step is competed.

As mentioned above, in the facedown bonding step according to this embodiment, the semiconductor chips 5 and the package substrates 3 are first irradiated with Ar atomic beams in the evacuated surface activation chamber 17, whereby natural oxide films and foreign matter are removed from the surfaces of the CCB bumps 2 and the surfaces of the electrodes 4. Next, the semiconductor chip 5 and the package substrate 3 are immediately transferred into the bonding chamber 20 filled with the high-purity inert gas atmosphere, thereby preventing the re-formation of natural oxide films or re-deposition of foreign matter on the surfaces of the CCB bumps 2 or the surfaces of the electrodes 4 from occurring during the transfer from the surface activation chamber 17 into the bonding chamber 20. Subsequently, the CCB bumps 2 are temporarily bonded to the electrodes 4 so as to achieve perfect contact of the bumps 2 with the electrodes 4, whereby failure in connection between the CCB bumps 2 and the corresponding electrodes 4 is prevented from occurring due to diameter dispersion of the bumps 2 or warpage of the package substrate 3. Then, the package substrate 3 (with the semiconductor chip 5 temporarily bonded to the principal surface thereof) is transferred onto the fusion bonding stage 27, thereby preventing the slippage between the CCB bumps 2 and the corresponding electrodes 4 due to vibration or the like during the transfer. Subsequently, the eutectic solder layer 41 preliminarily segregated to the surface of each CCB bump 2 is caused to diffuse into the bump 2 and into the corresponding electrode 4, thereby bonding the bump 2 and the electrode 4 to each other.

By the above-mentioned facedown bonding step, it is possible to carry out the facedown bonding of the semiconductor chip 5 to the principal surface of the package substrate 3 at a temperature near the melting point of the eutectic solder. Thus, the facedown bonding step according to this embodiment makes it possible to reduce markedly the heat damage to the semiconductor chip, to complete the facedown bonding in a shorter time, and to use a smaller apparatus, as compared with the prior art in which facedown bonding is performed by effecting reflow of CCB bumps in a reflow furnace set at a temperature considerably higher than the melting temperature of a non-eutectic solder.

Now, the step of hermetically sealing (or encapsulating) the semiconductor chip 5 by soldering the cap 6 to the principal surface of the package substrate 3 will be explained.

Figure 9:
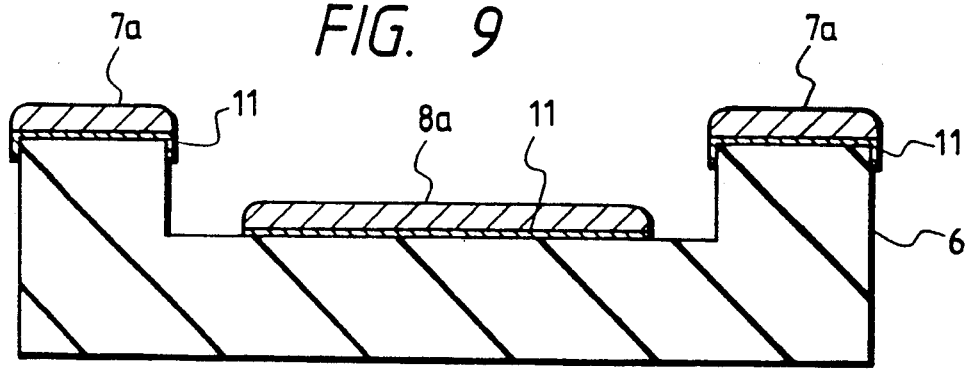
FIG. 9 is a sectional view of a cap, illustrating a preliminary solder forming step in the embodiment.

First, as shown in FIG. 9, a sealing preliminary solder 7a and a heat-transmitting preliminary solder 8a are deposited on the surfaces of the soldering metallization layers 11 provided on the cap 6. The preliminary solders 7a and 8a both comprise a pb-Sn alloy with an Sn content of about 10% by weight (melting temperature=about 290° to 300° C.). The preliminary solders 7a and 8a are deposited by placing solder preforms (not shown) of predetermined shapes on the soldering metallization layers 11, and melting the solder preforms by heating in a melting furnace filed with a nitrogen, Ar or other similar inert gas atmosphere.

Figure 10:
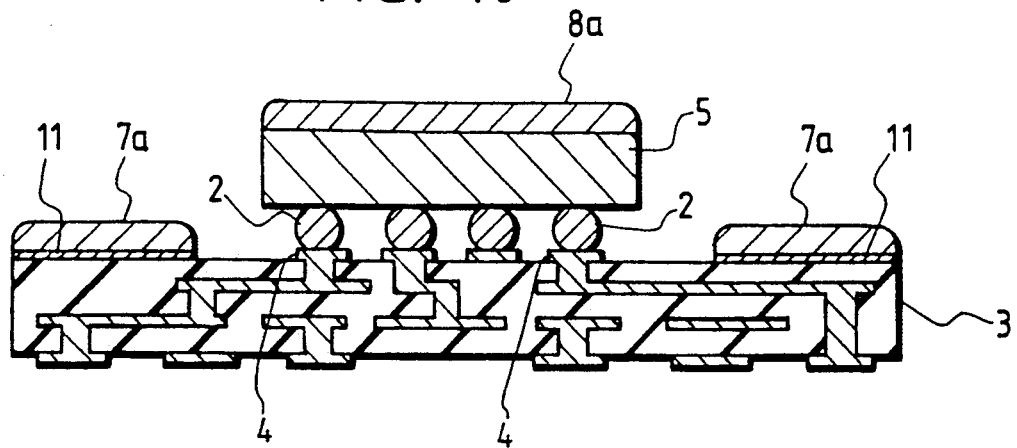
FIG. 10 is a sectional view of the semiconductor chip and the package substrate, illustrating a preliminary solder forming step in the embodiment.

The sealing preliminary solder 7a and the heat-transmitting preliminary solder 8a may be deposited on the surfaces of the soldering metallization layers 11 on the package substrate 3 and on the back side of the semiconductor chip 5 after completion of the facedown bonding, as illustrated in FIG. 10. Further, the preliminary solders 7a and 8a may be deposited on both the cap 6 and the package substrate 3. The following explanation will be made of the case where the preliminary solders 7a and 8a are deposited only on the cap 6 (FIG. 9).

Next, a predetermined number of the caps 6 are placed on an exclusive cap tray (not shown), to be contained into the loading magazine 14a of the apparatus 12. A predetermined number of the package substrates 3, for which the facedown bonding step is finished, are placed on the substrate tray 15b, to be contained into the loading magazine 14b.

Then, a surface activation treatment, temporary bonding, and reflow of solder are carried out similarly to the above-mentioned facedown bonding step.

Figure 1:
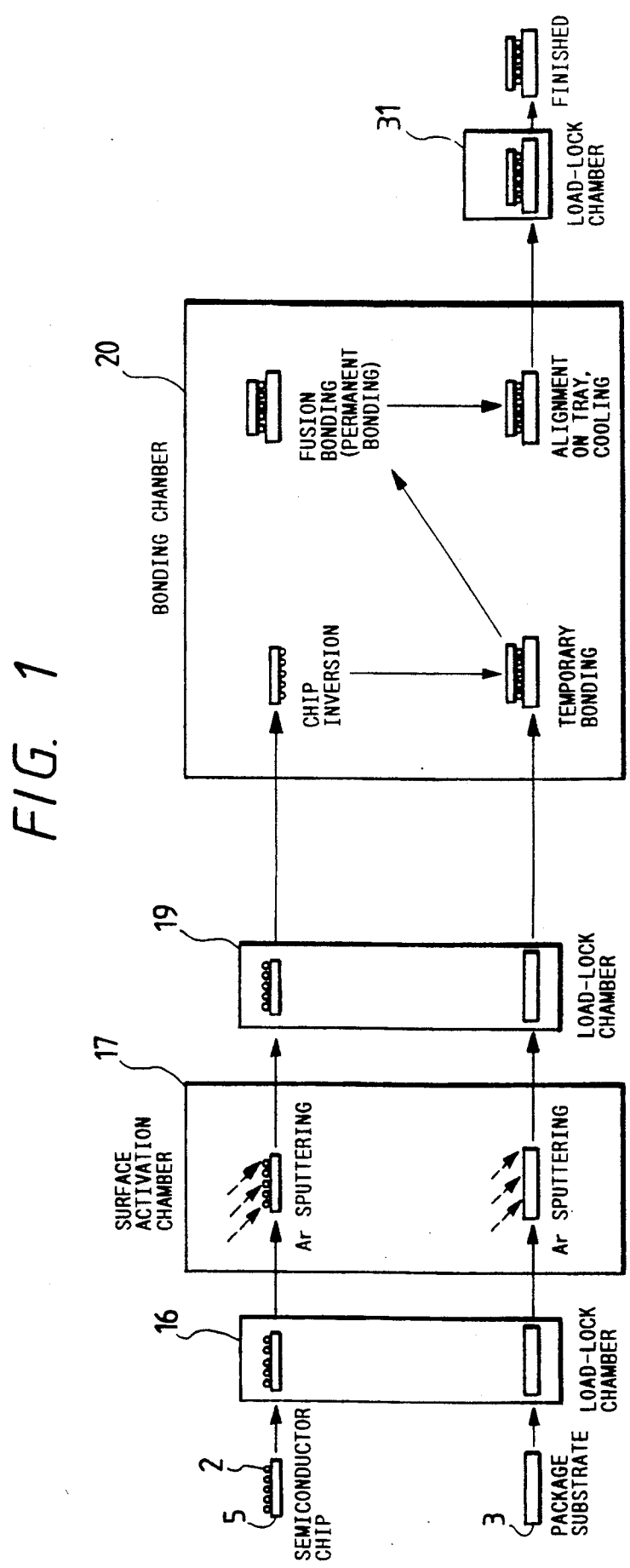
FIG. 1 is a flow diagram illustrating the process for fabricating a semiconductor integrated circuit device according to one embodiment of this invention.

Namely, as has been explained referring to FIGS. 1 and 2, one cap tray and one substrate tray 15b are transferred through the load-lock chamber 16 into the surface activation chamber 17. In the activation chamber 17, the source guns 18 are operated in a high-purity Ar gas atmosphere of about $10^{-3}$ to $10^{-4}$. Torr, thereby irradiating the principal surfaces of the package substrates 3 and the caps 6 uniformly with Ar atomic beams. The irradiation with the Ar atomic beams removes natural oxide films and foreign matter from the surfaces of the preliminary solders 7a and 8a, thereby activating the surfaces. Simultaneously, natural oxide films and foreign matter are removed from the surfaces of the soldering metallization layers 11 provided on the principal surfaces of the package substrates 3, whereby the surfaces are activated.

Next, the cap tray and the substrate tray 15b are transferred through the second load-lock chamber 19 into the bonding chamber 20 provided therein with a high-purity nitrogen gas (or Ar gas) atmosphere namely, a normal-pressure condition), in which the cap tray is placed on the chip inversion stage 21, and the substrate tray 15b on the temporary bonding stage 24. After the cap 6 is inverted, or turned 180°, by use of the plung-up pin 32 and the collet 33, the inverted cap 6 is transferred onto the temporary bonding stage 24 by the chip transfer hand 23. During the transfer, the cap 6 is heated by a heater incorporated in the chip transfer hand 23. The heating is performed at a temperature (e.g., 250° C.) slightly lower than the melting temperatures of the preliminary solders 7a and 8a. In the heating, the surfaces of the CCB bumps 2 cannot be re melted, because the above-mentioned eutectic solder layer 41 segregated to the surfaces of the CCB bumps 2 is completely diffused into the bumps 2 and the electrodes 4 in the above-mentioned facedown bonding step.

Figure 11:
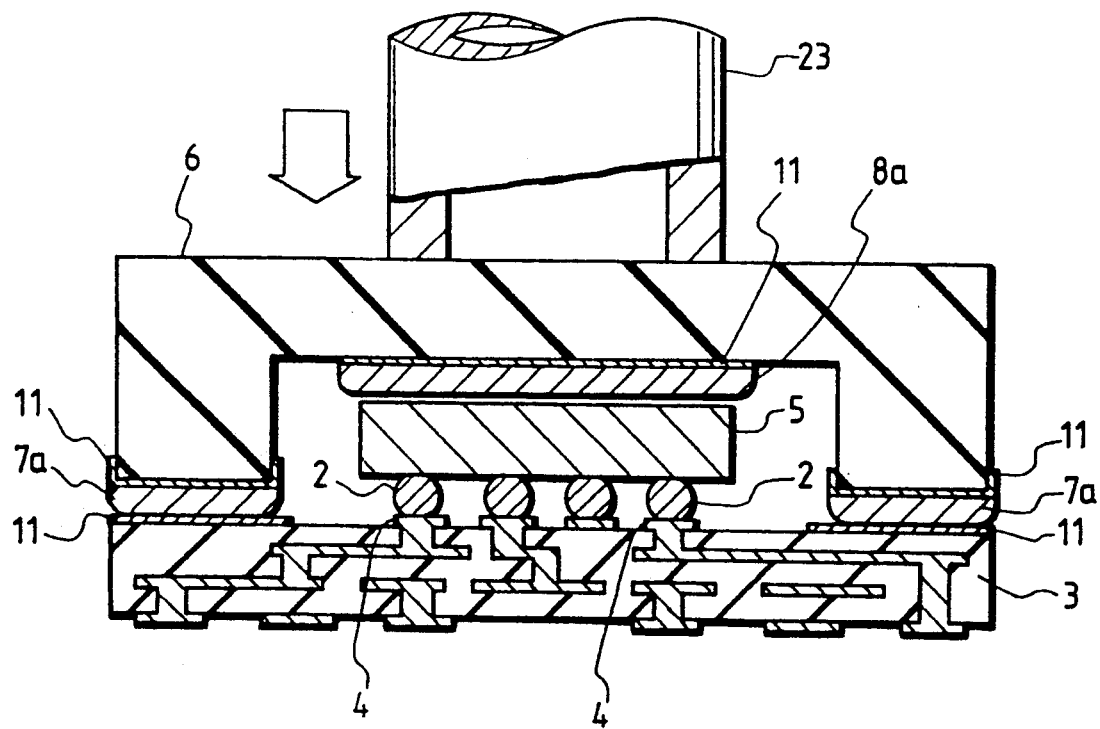
FIGS. 11 and 12 are each a sectional view of a chip carrier, illustrating a hermetic sealing step (encapsulating step) in the embodiment.

Subsequently, the position of the cap 6 projected on the prism mirror 25 shown in FIG. 6 is detected by the position recognition camera 26, and the precision XY table 34, high speed XY table 35 and turntable 36 are driven to position one package substrate 3 right under the cap 6. Thereafter, as shown in FIG. 11, the chip transfer hand 23 is lowered to press the base portion of the cap 6 against the principal surface of the package substrate 3 (load=about 0.5 to 5 kgf/cm$^2$), whereby the cap 6 is temporarily bonded to the principal surface of the substrate 3. The temporary bonding prevents the slippage between the cap 6 and the package substrate 3 from occurring due to vibration or the like at the time of transferring the package substrate 3 (with the cap 6 temporarily bonded to the principal surface thereof) onto the fusion bonding stage 27.

Figure 12:
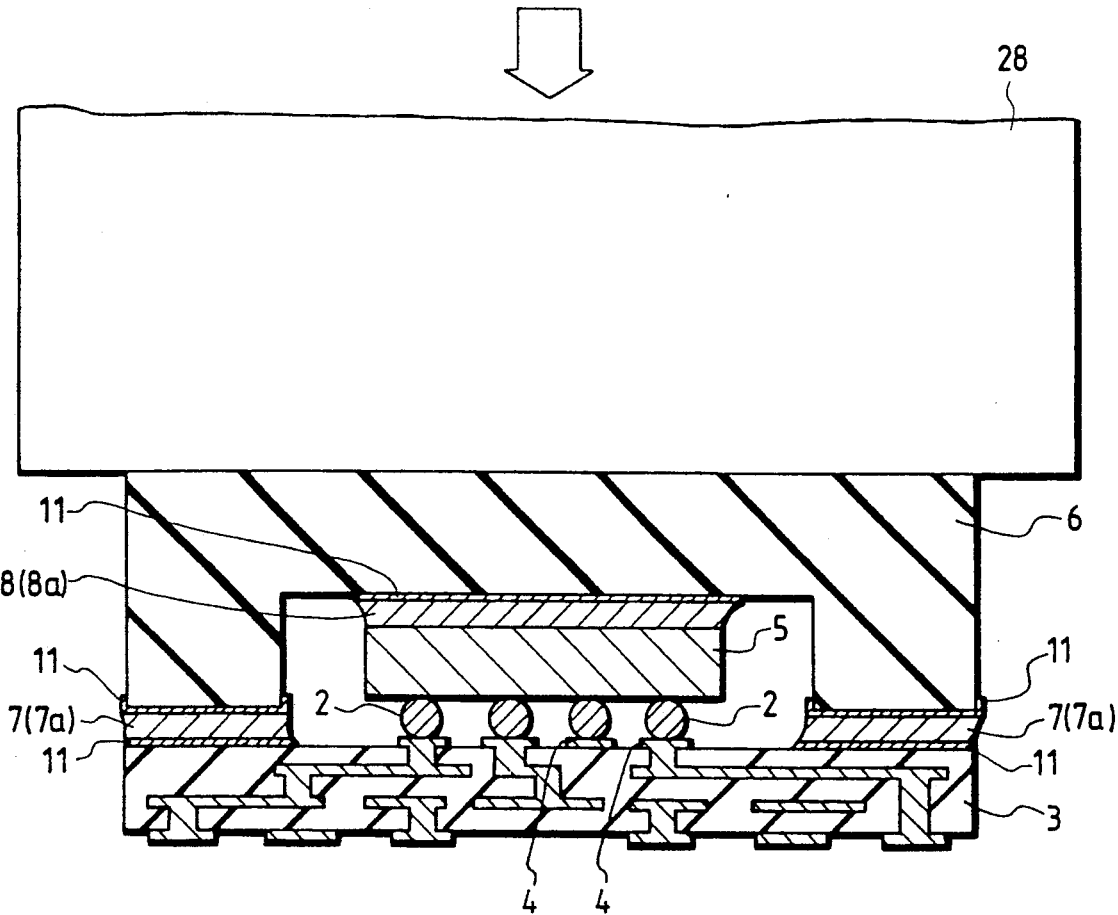

After the cap 6 is transferred together with the package substrate 3 onto the fusion bonding stage 27 by the chip transfer hand 23, the heat block 28 is lowered, as shown in FIG. 12, to heat the cap 6 while exerting a load of about 0.5 to 5 kgf/cm$^2$ on the upper surface of the cap 6. The heating is carried out at a temperature (e.g., 310° C.) slightly higher than the melting temperatures of the preliminary solders 7a and 8a. By the heating, the sealing preliminary solder 7a and the heat-transmitting preliminary solder 8a are re-melted, resulting in that the cap 6 is soldered to the principal surface of the package substrate 3 and, simutaneously, the back side of the semiconductor chip 5 is soldered to the lower surface of the cap. In addition, the application of the load to the upper surface of the cap 6 enhances the wettability by the preliminary solders 7a and 8a. Besides, the CCB bumps 2 cannot be re-melted when the preliminary solders 7a and 8a are melted, because the melting temperature of the CCB bumps 2 is about 320° to 330° C.

After the semiconductor chip 5 is hermetically sealed (or encapsulated) by the cap 6 as above, the cap 6 is sucked by the chip transfer hand 29, and is transferred together with the package substrate 3 onto the aligning stage 30, to be cooled to room temperature. After the cooling, the packages semiconductor chips 5 are contained into the unloading magazine 37 through the third load-lock chamber 3, whereby the hermetic sealing (encapsulating) step is completed and the chip carriers 1 are finished.

Thus, in the hermetic sealing (encapsulating) step according to this embodiment, it is possible to hermetically seal (encapsulate) the semiconductor chip 5 at a temperature near the melting temperatures of the preliminary solders 7a and 8a. The hermetic sealing step, therefore, makes it possible to reduce markedly the heat damage to the semiconductor chip, and to complete the hermetic sealing in a shorter time, as compared with the prior art in which the hermetic sealing (encapsulation) is conducted by effecting the reflow of the preliminary solders 7a and 8a in a reflow furnace set at a temperature considerably higher than the melting points of the solders 7a and 8a.

Now, the step of bonding the CCB bumps 9 to the electrodes 4 on the lower side of the package substrate 3 will be explained below.

Figure 13:
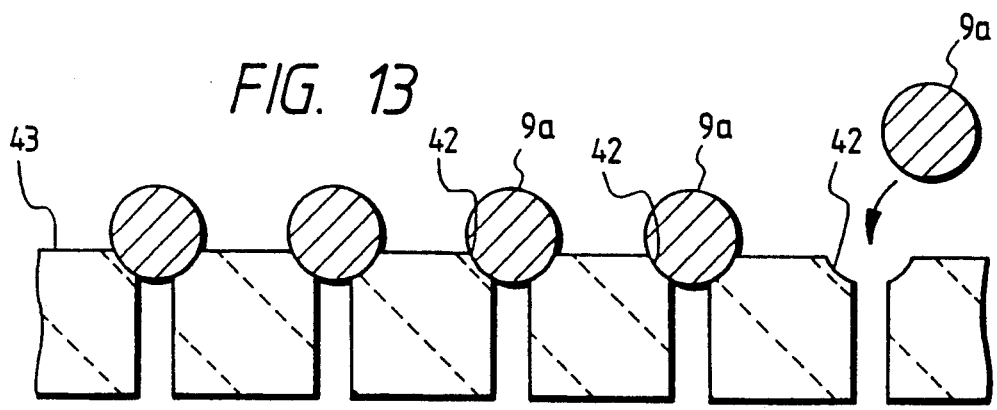
FIG. 13 is a partial sectional view of a glass jig, illustrating the CCB bump forming step in the embodiment.

First, as shown in FIG. 13, solder balls 9a are supplied to the principal surface of the glass jig 43 provided with a multiplicity of holes 42, thereby fitting one solder ball 9a in each of the holes 42. The number and positions of the holes 42 correspond respectively to the number and positions of the electrodes 4 provided on the lower side of the package substrate 3. The solder balls 9a comprise an Sn-Ag alloy with an Ag content of about 3.5% by weight (melting temperature=about 220° to 230° C.).

Next, a predetermined number of the glass jigs 43 are placed on an exclusive tray (not shown), to be contained into the loading magazine 14a of the apparatus 12. A predetermined number of the chip carriers 1 are placed on the substrate tray 15b, to be contained into the loading magazine 14b. The chip carriers 1 are each placed in the condition where the lower side thereof (the side on which the electrodes 4 for bonding the CCB bump 9 thereto are provided) is directed upward.

Thereafter, surface activation treatment, temporary bonding, and reflow of solder are carried out similarly to the facedown bonding step and the hermetic sealing (encapsulating) step.

Namely, the glass jigs 43 and the chip carriers 2 are transferred into the surface activation chamber 17 through the load-lock chamber 16 shown in FIGS. 1 and 2, and the solder balls 9 and the electrodes 4 are irradiated with Ar atomic beams to remove natural oxide films and foreign matter from the surfaces of the solder balls 9 and the electrodes 4. Subsequently, the glass jigs 43 and the chip carriers 1 are transferred through the load-lock chamber 19 into the bonding chamber 20, in which the chip carrier 1 is inverted, or turned 180°, and the electrodes 4 are pressed against the solder balls 9a to effect temporary bonding. The temporary bonding is carried out at a temperature (e.g., 150° C.) slightly lower than the melting temperature of the solder balls 9a. Next, the chip carriers 1 are transferred onto the fusion bonding stage 27, where the solder balls 9a are heated at a temperature (e.g., 250° C.) slightly higher than the melting temperature thereof. By the heating, the solder balls 9a are melted and the CCB bumps 9 are bonded to the electrodes 4 (FIG. 14(a)).

Thus, in the bump bonding step according to this embodiment, it is possible to bond the CCB bumps 9 to the electrodes 14 on the lower side of the package substrate 3, at a temperature near the melting point of the solder balls 9a and in a short time.

As described above, according to this embodiment, fabrication of the chip carrier 1 (facedown bonding, hermetic sealing, or encapsulation, and CCB bump bonding) is carried out by use of the above-mentioned apparatus 12 in which the vacuum surface activation chamber 17 provided with the source guns for generating Ar atomic beams and the bonding chamber 20 equipped with the temporary bonding mechanism and the fusion bonding mechanism and filed with the high-purity inert gas atmosphere are connected to each other through the load-lock chamber 19, whereby it is possible to perform favorable soldering in each of the steps, without use of flux. Therefore, (1) the need for a flux application step and the need for a flux cleaning step are eliminated, and the number of steps for fabrication of the chip carried, 1 is reduced accordingly; (2) it is possible to obviate the corrosion of the wiring in the integrated circuit due to a flux residue; (3) because the generation of defects in the solder bond portions due to the flux residue is avoided, it is possible to realize higher reliability of connection of the CCB bumps 2 and 9, higher reliability of hermetic seal of the chip carrier 1, and a higher cooling efficiency.

While the invention made by the present inventors has been explained in detail referring to the embodiment hereinabove, it is to be understood that this invention is not limited to the above-mentioned embodiment and that various changes and modifications may be made without departing from the spirit and scope of this invention.

The above embodiment, in which the formation of the CCB bumps on the electrodes of the semiconductor chip is followed immediately by rapid cooling of the CCB bumps to segregate the eutectic solder layer (or a solder layer with a composition close to the eutectic solder composition) to the surfaces of the bumps and, thereafter, the facedown bonding of the semiconductor chip to the package substrate is carried out utilizing the diffusion of the eutectic solder layer, is not a limitative embodiment, and CCB bumps not provided with the eutectic solder layer on the surfaces thereof may also be used. In that case, also, it is possible to achieve the desired facedown bonding at a temperature near the melting point of the non-eutectic solder constituting the CCB bumps, by carrying out the temporary bonding and reflow in the bonding chamber filled with the high-purity inert gas atmosphere, immediately upon removal of oxide films and foreign matter from the surfaces of the CCB bumps in the surface activation chamber. It is therefore possible to reduce markedly the heat damage to the semiconductor chip and to complete the facedown bonding in a shorter time, as compared with the prior art in which the facedown bonding is carried out by effecting the reflow of the CCB bumps in a reflow furnace set at a temperature much higher than the melting point of a non-eutectic solder.

Furthermore, a metal softer than the metals to be bonded may be provided beforehand on a bonding surface of at least one of the CCB bump and the corresponding electrode so as to give the bonding surface an ultra-smooth finish, thereby contriving close contact of the bonding surfaces through utilizing a plastic deformation of the softer metal. In that case, the bonding portions may be heated to lower the yield point of the softer metal, for the purpose of reducing the bonding pressure required. The softer metal may be, for example, Sn.

Although the above embodiment has been explained referring to an application of this invention to a method for fabrication of a chip carrier (facedown bonding, hermetic seal, or encapsulation, and CCB bump bonding), the invention is applicable a)so to a step of mounting the chip carrier on a module substrate through the CCB bumps.

Further, this invention is applicable to a method of fabricating a so-called multi-tip package in which a plurality of semiconductor chips facedown-bonded to the principal surface of a package substrate are hermetically sealed (or encapsulated) by a cap.

Figure 16:
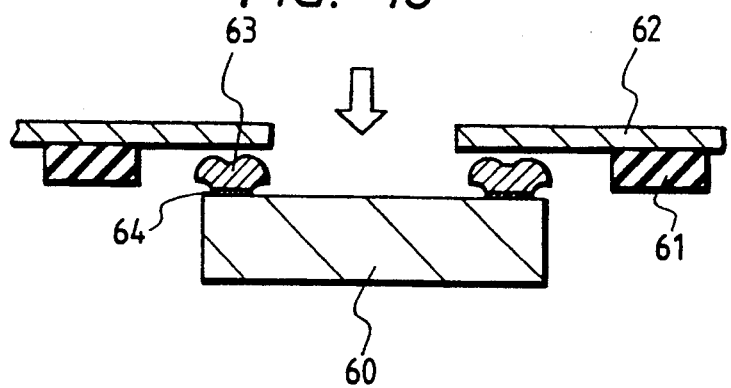
FIG. 16 is a sectional view of an important portion for illustrating a process for fabricating a semiconductor integrated circuit device according to another embodiment of this invention.

Moreover, this invention is applicable not only to a method of producing a flip chip but to a method of producing a TAB package, as shown in FIG. 16. Namely, a semiconductor chip 60 is gang-bonded through bumps 63 to leads 62 provided on a principal surface of an insulation film 61 as follows. First, a soldering primary coat comprising a composite metallic film of, for example, Cr, Cu and Au is vapor deposited on the surfaces of Al electrodes 64 of a semiconductor chip 60. Thereafter, solder bumps 63 are provided on the electrodes by a solder vapor deposition method or a solder ball supply method. The solder bumps 63 are then immediately cooled rapidly, whereby a eutectic solder layer (or a solder layer with a composition close to the eutectic solder composition) is segregated to the surfaces of the bumps 63. Then, the semiconductor chip 60 and the insulation film 61 are contained into a vacuum vessel such as the above-mentioned surface treatment chamber, in which the surfaces of the solder bumps 63 and the surfaces of the leads 62 are irradiated with Ar atomic beams to remove oxide films and foreign matter from the surfaces. Immediately thereafter, the semiconductor chip 60 and the insulation film 61 are transferred into a vessel filled with a high-purity inert gas atmosphere, and the leads 62 are pressed against the solder bumps 63 in the vessel, thereby achieving the gang bonding.

According to the method of producing a TAB package as mentioned above, it is possible to provide the bumps by use of a solder less expensive than Au and, therefore, to reduce the manufacturing cost of the TAB package.

While the above explanation has been made of the cases where the invention is applied to flip chip or TAB packages, which belong to the field constituting the background of the invention, this invention widely applicable as a metal bonding method for semiconductor parts, electronic parts and optical parts, for instance, those in mounting of an LSI or in ultrasonic probes, EDX incident windows, laser diode packages, etc. Where charge up on bonding surfaces of metal members does not cause any trouble in bonding the parts, the surface activation through irradiation with the Ar atomic beam may be substituted by the surface activation through irradiation with an ion beam such as an Ar ion beam.

The effects obtained by the representative ones of the inventions disclosed in this application will be briefly explained as follows.

(I) A method of fabricating a semiconductor integrated circuit device according to one invention in this application comprises, in facedown bonding of a semiconductor chip to a substrate through CCB bumps, the steps of placing the semiconductor chip and the substrate into a vacuum vessel, irradiating the surfaces of the CCB bumps and the surfaces of electrodes on the substrate with an atomic or ion energy beam, then immediately transferring the semiconductor chip and the substrate into a vessel filled with a high-purity inert gas atmosphere, pressing the CCB bumps against the electrodes under normal pressure to effect temporary bonding, and thereafter effecting reflow of the CCB bump. This method makes it possible to effect the reflow of the CCB bumps at a temperature near the melting temperature of the bumps and, therefore, to reduce the heat damage to the semiconductor chip. It is also possible to realize shortening of the reflow time and a reduction in the capacity of a reflow furnace required.

Besides, the method of fabricating a semiconductor integrated circuit device according to this invention eliminates the need for use of a flux in the facedown bonding of the semiconductor chip to the substrate through the CCB bumps. Therefore, the need for a flux application step and the need for a flux cleaning step are eliminated, and the number of steps for facedown bonding is reduced accordingly. It is also possible, by the method according to this invention, to obviate the corrosion of wiring in an integrated circuit due to a flux residue. It is further possible, by the method, to prevent defects in solder bond portions from being generated due to the flux residue so that the reliability of connection of the CCB bumps is enhanced.

(II) A method of fabricating a semiconductor device according to another invention disclosed herein comprises providing the CCB bumps by use of a non-eutectic solder, melting the non-eutectic solder and then immediately cooling the melted non eutectic solder rapidly to cause segregation of a eutectic solder layer or a solder layer close in composition to the eutectic solder layer to the surfaces of the CCB bumps, prior to facedown bonding in the same manner as in the invention relevant to the above description (I). This method makes it possible to effect the reflow of the CCB bumps at a further lower temperature and to further reduce the heat damage to the semiconductor chip, as compared with the invention relevant to the above description (I).

(III) A method of fabricating a semiconductor integrated circuit device according to a further invention disclosed herein comprises, in fabricating a TAB package by gang bonding of a semiconductor chip through bumps to leads provided on a principal surface of an insulation film, the steps of pacing the semiconductor chip and the insulation film into a vacuum vessel, irradiating the surfaces of the bumps and the surfaces of the leads with an atomic or ion energy beam, then immediately transferring the semiconductor chip and the insulation film into a vessel filled with a high-purity inert gas atmosphere, and pressing the leads against the bumps in the vessel filled with the inert gas atmosphere to effect the gang bonding. This method makes it possible to provide the bumps by use of a metallic material less expensive than Au and, therefore, to reduce the manufacturing cost of the TAB package.

What is claimed is:

1. A method of bonding a set of metal members which comprises the steps of:
   (a) irradiating respective bonding surfaces of a pair of metal members disposed in a vacuum vessel with an atomic beam;
   (b) transferring said metal members into another vessel continuous with said vacuum vessel, said another vessel provided therein with a high-purity inert gas atmosphere; and
   (c) pressing said bonding surfaces of said metal members against each other under norma pressure in said another vessel provided therein with the high-purity inert gas atmosphere.

2. A method of bonding a set of metal members according to claim 1 comprising:
   heating said metal members to a temperature not higher than the melting temperatures of said metal members in step (c).

3. A method of bonding a set of metal members according to claim 1,
   wherein at least one of said metal members comprises a non eutectic alloy.

4. A method of bonding a set of metal members according to claim 3, further comprising before step (a):
   (d) meting said non-eutectic alloy and rapidly cooling said melted non-eutectic alloy to cause segregation of a eutectic alloy layer to the surface of said non-eutectic alloy.

5. A method of bonding a set of metal members according to claim 3,
   wherein said non-eutectic alloy is a solder.

6. A method of bonding a set of metal members which comprises the steps of:
   (a) irradiating respective bonding surfaces of a pair of metal members disposed in a vacuum vessel with an atomic beam, said pair of metal members having a first metal member and a second metal member;
   (b) transferring said metal members into a bonding vessel continuous with said vacuum vessel, said bonding vessel having a first bonding zone and a second bonding zone, said bonding vessel provided therein with a high-purity inert gas atmosphere;
   (c) inverting, or turning 180°, said first metal member in said first bonding zone in said bonding vessel and pressing said first metal member against said second metal member under normal pressure, and
   (d) transferring said metal members into said second bonding zone in said bonding vessel and heating said metal members, thereby fusion-bonding said metal members to each other.

7. A method of bonding a set of metal members according to claim 6 comprising:

heating said metal members to a temperature not higher than the meting temperatures of said metal members in step (d).

8. A method of bonding a set of metal members according to claim 6,
wherein said first metal member comprises a non-eutectic alloy.

9. A method of bonding a set of metal members according to claim 8,
wherein said non-eutectic alloy is a solder.

10. A method of bonding a set of metal members according to claim 8, further comprising before step (a):
(d) melting said non-eutectic alloy and rapidly cooling said melted non-eutectic alloy to cause segregation of a eutectic alloy layer to the surface of said non-eutectic alloy.

11. A method of fabricating a semiconductor device which comprises the steps of:
(a) preparing a semiconductor chip provided with integrated circuits and projected electrodes on a principal surface thereof, and a substrate for mounting said semiconductor chip thereon;
(b) disposing said semiconductor chip and said substrate in a vacuum vessel, and irradiating said projected electrodes and a mount surface of said substrate with an atomic beam;
(c) transferring said semiconductor chip and said substrate into a bonding vessel continuous with said vacuum vessel, said bonding vessel provided therein with a high-purity inert gas atmosphere, and said bonding vessel having a first bonding zone and a second bonding zone;
(d) inverting, or turning 180°, said semiconductor chip in said first bonding zone to oppose said projected electrodes to said mount surface, and pressing said projected electrodes against said mount surface under normal pressure;
(e) transferring said substrate with said semiconductor chip mounted thereon into said second bonding zone and heating said substrate and semiconductor chip, thereby fusion-bonding said substrate and said semiconductor chip to each other;
(f) preparing a roughly U-shaped encapsulating material comprising a recessed lower surface portion and a projected base portion, said lower surface portion and said projected base portion provided with a bonding layer;
(g) disposing said substrate with said semiconductor chip mounted thereon and said encapsulating material in a vacuum vessel, and irradiating a back surface of said semiconductor chip, said substrate, said lower surface portion and said projected base portion with an atomic beam;
(h) transferring said substrate with said semiconductor chip mounted thereon and said encapsulating material into said first bonding zone, then inverting, or turning 180°, said encapsulating material, and pressing said substrate and said base portion against each other and said back surface of said chip and said lower surface portion against each other under normal pressure; and
(i) transferring said substrate encapsulated by said encapsulating material into said second bonding zone, and heating said substrate and encapsulating material, thereby fusion-bonding said substrate and said encapsulating material to each other.

12. A method of fabricating a semiconductor device according to claim 11,
wherein said projected electrodes and said bonding layer comprise a non-eutectic alloy.

13. A method of fabricating a semiconductor device according to claim 12,
wherein said non-eutectic alloy is a solder.

14. A method of fabricating a semiconductor device according to claim 12, further comprising before step (a):
(j) melting said non eutectic alloy and rapidly cooling said melted non-eutectic alloy to cause segregation of a eutectic alloy layer to the surface of said non eutectic alloy.

15. A method of fabricating a semiconductor device according to claim 12, further comprising between steps (e) and (f):
(j) melting said non-eutectic alloy and rapidly cooling said melted non-eutectic alloy to cause segregation of a eutectic alloy layer to the surface of said non-eutectic alloy.

16. A method of fabricating a semiconductor device which comprises the steps of:
(a) preparing a semiconductor chip provided with integrated circuits and projected electrodes on a principal surface thereof and metal leads;
(b) disposing said semiconductor chip and said leads in a vacuum vessel, and irradiating said projected electrodes and leads with an atomic beam;
(c) transferring said semiconductor chip and said leads into a bonding vessel continuous with said vacuum vessel, said bonding vessel provided therein with a high-purity inert gas atmosphere; and
(d) pressing said projected electrodes and said leads against each other under normal pressure in said bonding vessel.

17. A method of fabricating a semiconductor device according to claim 16,
wherein said projected electrodes and said bonding layer comprises a non-eutectic alloy.

18. A method of fabricating a semiconductor device according to claim 17,
wherein said non-eutectic alloy is a solder.

19. A method of fabricating a semiconductor device according to claim 17, further comprising before step (a):
(e) melting said non eutecting alloy and rapidly cooling said melted non eutectic alloy to cause segregation of a eutectic alloy layer to the surface of said non-eutectic alloy.

20. An apparatus for producing a semiconductor device comprising:
an activation chamber having a source gun for radiating an atomic beam and an evacuation mechanism; and
a bonding chamber having a press-bonding mechanism, a fusion bonding mechanism, and means for supplying a high-purity inert gas to develop normal pressure inside said bonding chamber,
wherein said activation chamber and said bonding chamber ar provided in connection with each other.

21. An apparatus for producing a semiconductor device according to claim 20, further comprising:
a first load-lock chamber for connecting said activation chamber with said bonding chamber.

22. An apparatus for producing a semiconductor device according to claim 20, further comprising, in said press-bonding mechanism;

means for inverting, or turning 180°, one part; and means for press-bonding said one part to another part.

23. An apparatus for producing a semiconductor device according to claim 20, further comprising, in said fusion bonding mechanism:

a stage for mounting said semiconductor device thereon; and means for heating.

24. An apparatus for producing a semiconductor device according to claim 20, further comprising:

a part-containing chamber connected to said bonding chamber through a second load-lock chamber.

* * * * *